(12) United States Patent
Cheng et al.

(10) Patent No.: US 7,465,642 B2
(45) Date of Patent: Dec. 16, 2008

(54) METHODS FOR FORMING SEMICONDUCTOR STRUCTURES WITH BURIED ISOLATION COLLARS

(75) Inventors: Kangguo Cheng, Beacon, NY (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 266 days.

(21) Appl. No.: 11/262,128

(22) Filed: Oct. 28, 2005

(65) Prior Publication Data

US 2007/0099391 A1 May 3, 2007

(51) Int. Cl.
*H01L 21/76* (2006.01)
(52) U.S. Cl. .................. 438/423; 438/400; 438/526
(58) Field of Classification Search .......... 438/400, 438/423, 510, 524; 257/E21.545
See application file for complete search history.

(56) References Cited

U.S. PATENT DOCUMENTS

| | | | |
|---|---|---|---|
| 4,016,017 A * | 4/1977 | Aboaf et al. ............. | 438/441 |
| 6,008,104 A | 12/1999 | Schrems | |
| 6,020,250 A * | 2/2000 | Kenney .................... | 438/422 |
| 6,599,798 B2 | 7/2003 | Tews et al. | |
| 6,635,915 B2 | 10/2003 | Kokubun | |
| 2002/0072206 A1* | 6/2002 | Chen et al. ................ | 438/526 |
| 2007/0122956 A1* | 5/2007 | Chidambarrao et al. ..... | 438/197 |

\* cited by examiner

*Primary Examiner*—Bradley K Smith
(74) *Attorney, Agent, or Firm*—Wood, Herron & Evans, LLP

(57) ABSTRACT

A semiconductor structure including a trench formed in a substrate and a buried isolation collar that extends about sidewalls of the trench. The buried isolation collar is constituted by an insulator formed from a buried porous region of substrate material. The porous region is formed from a buried doped region defined using masking and ion implantation or by masking the trench sidewalls and using dopant diffusion. Advantageously, the porous region is transformed to an oxide insulator by an oxidation process. The semiconductor structure may be a storage capacitor of a memory cell further having a buried plate about the trench and a capacitor node inside the trench that is separated from the buried plate by a node dielectric formed on the trench sidewalls.

20 Claims, 12 Drawing Sheets

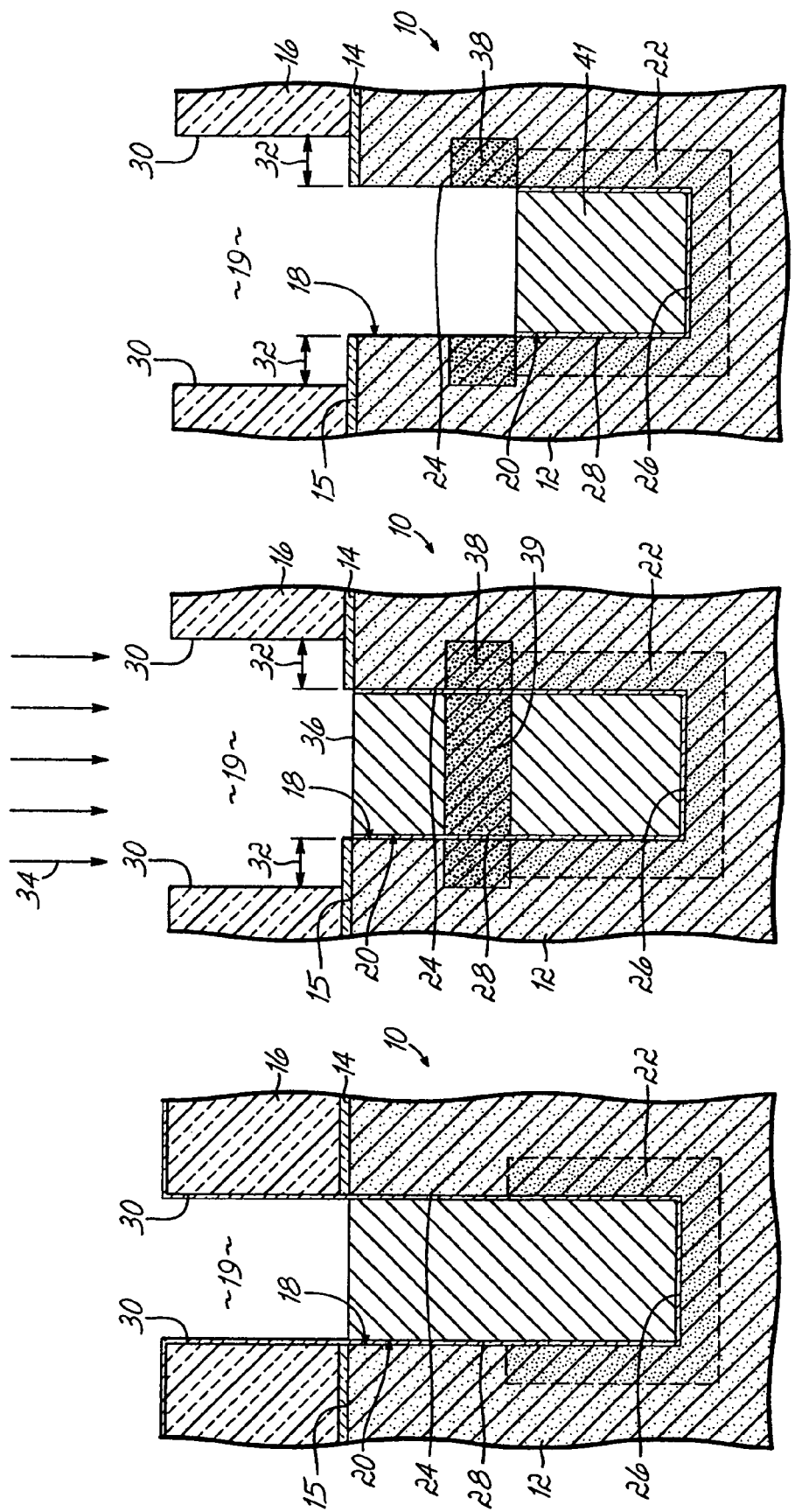

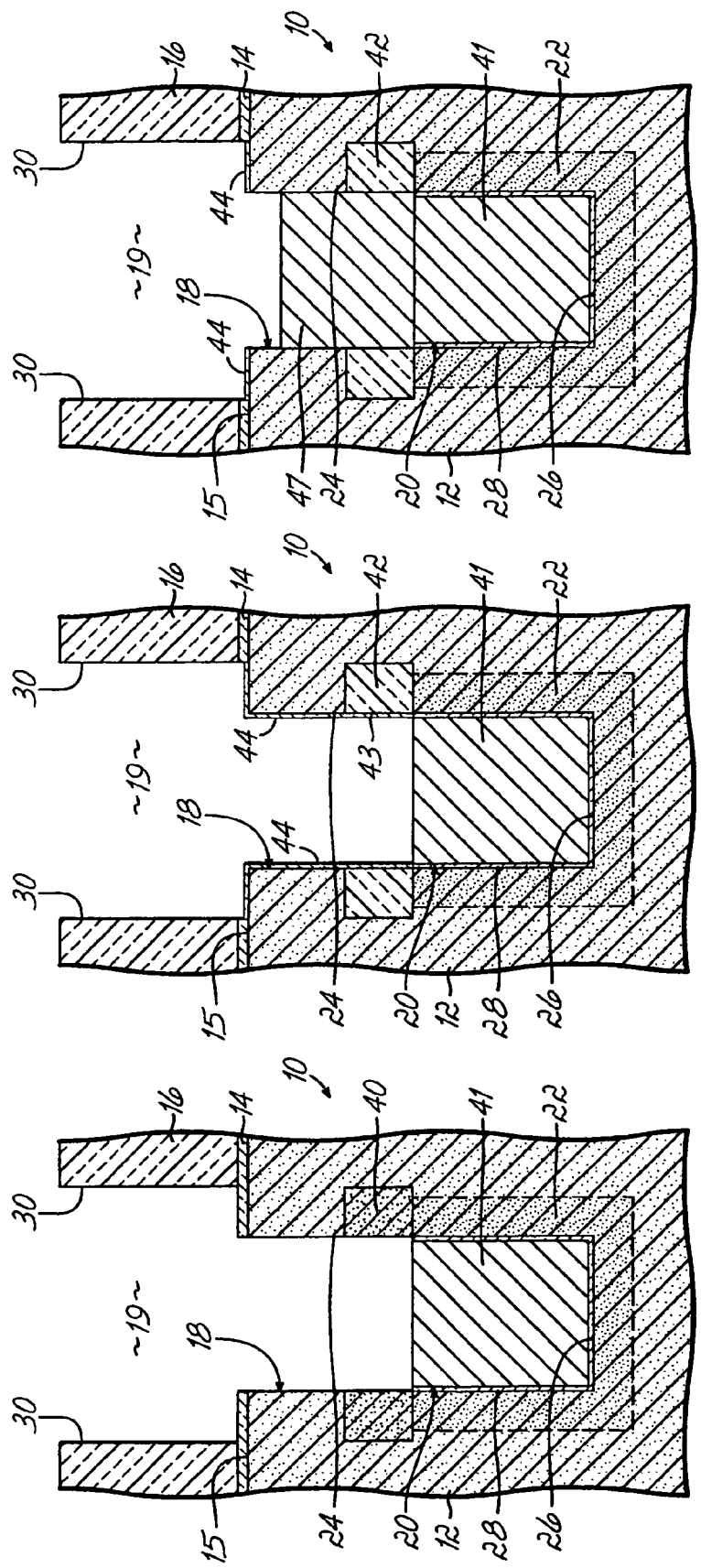

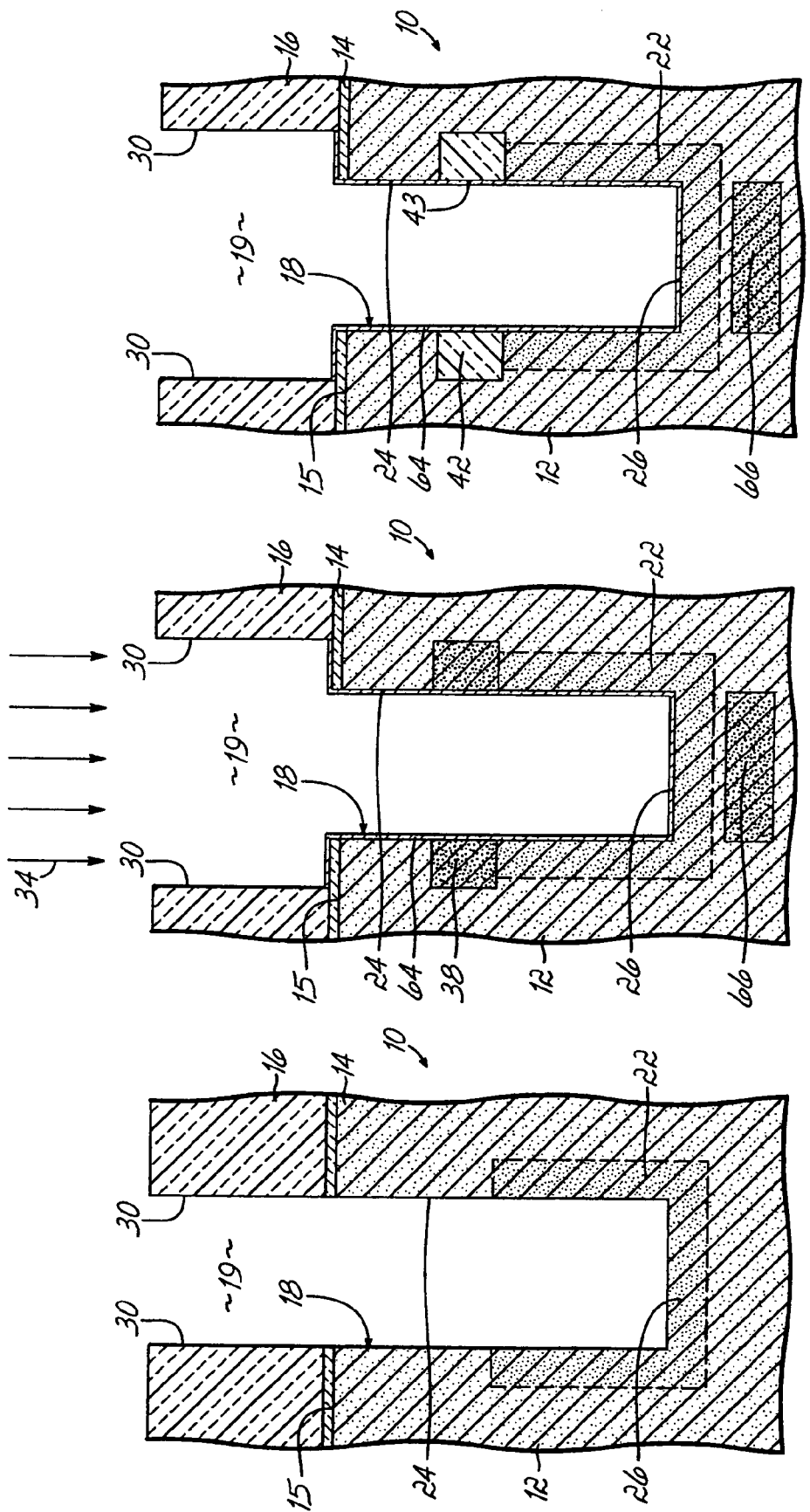

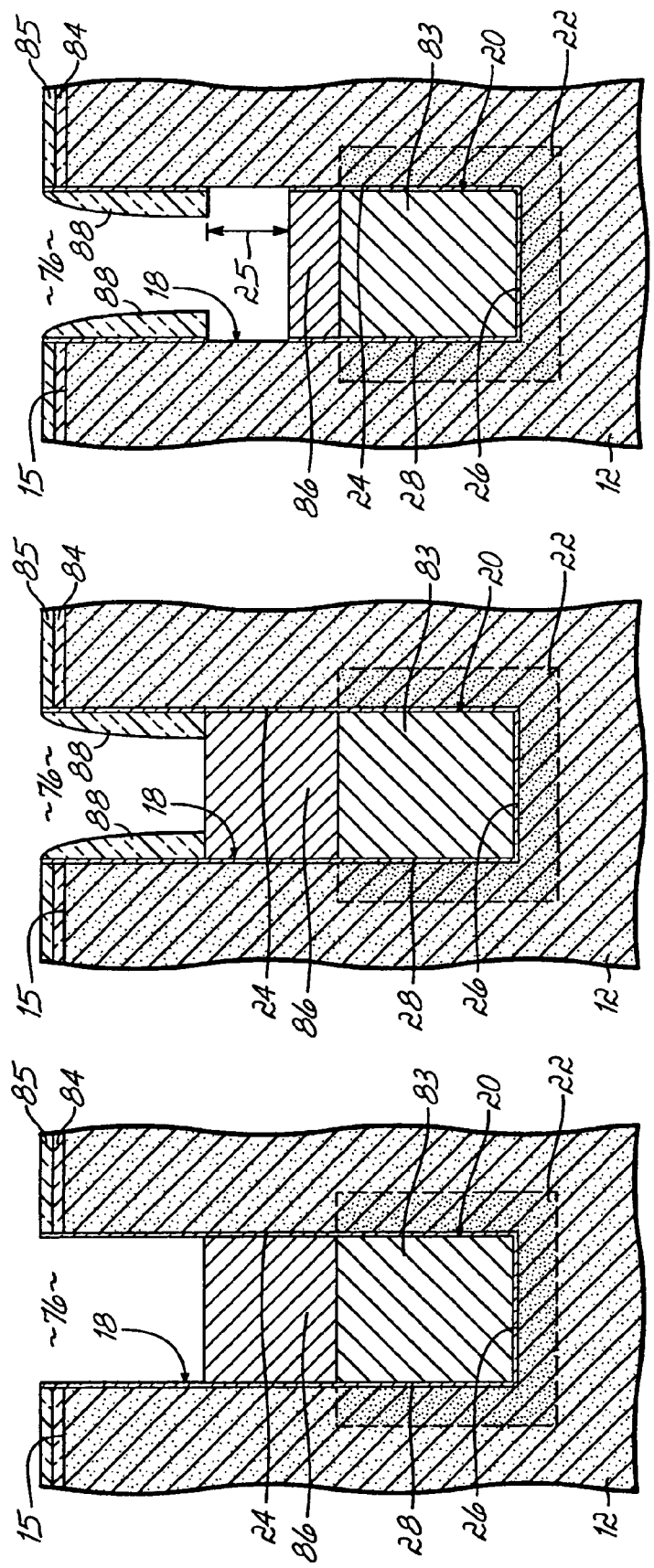

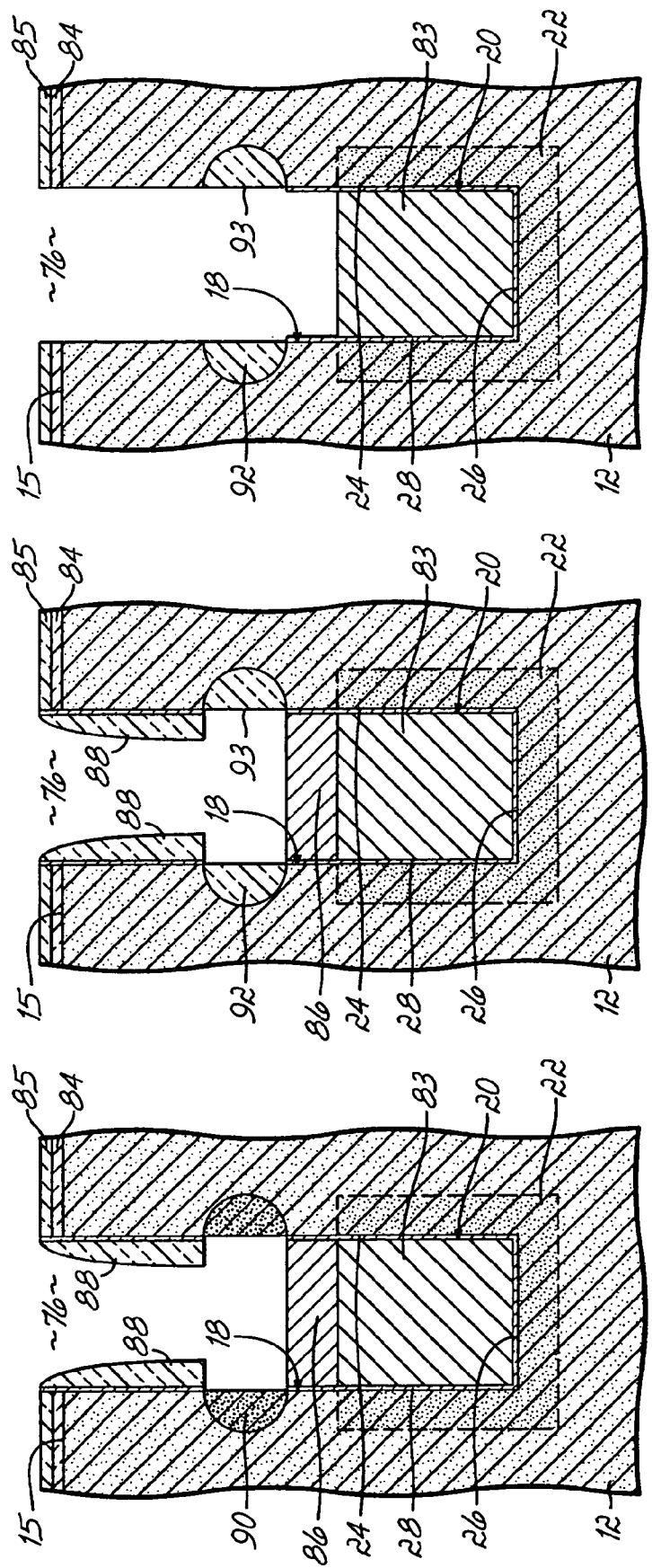

METHODS FOR FORMING SEMICONDUCTOR STRUCTURES WITH BURIED ISOLATION COLLARS

FIELD OF THE INVENTION

The invention relates generally to semiconductor structures and, in particular, to semiconductor structures with buried isolation collars and methods of forming such semiconductor structures.

BACKGROUND OF THE INVENTION

Dynamic random access memory (DRAM) devices are the most common type of semiconductor memory used for data storage and, thus, are found in many integrated circuit designs. A generic DRAM device includes a plurality of substantially identical semiconductor memory cell arrays, a plurality of bit lines, and a plurality of word lines that intersect the bit lines. Each memory cell array consists of multiple memory cells arranged in a matrix of addressable rows and columns. One of the word lines and one of the bit lines intersects the location of each individual memory cell in the memory cell array.

Each individual memory cell includes a storage capacitor for storing data and an access transistor, such as a planar or vertical metal oxide semiconductor field-effect transistor (MOSFET) or a fin-type field effect transistor (FinFET), serially connected with the storage transistor. During read and write operations, the access transistor controls the transfer of data charges to and from the storage capacitor. Because DRAM devices are a type of volatile memory that leaks stored charge, the data charge on the storage capacitor of each memory cell is periodically refreshed during a refresh operation. Either the source or drain of the access transistor is electrically connected to a corresponding bit line and the gate of the access device is electrically connected to a corresponding word line. In certain DRAM device designs, memory cells are arranged in pairs to allow sharing of a bit line contact, which significantly reduces the overall memory cell size.

When a signal routed on a word line activates the access transistor of one of the memory cells, the storage capacitor of the activated memory cell transfers a data signal to the bit line connected to the memory cell or a data signal from the bit line to the storage capacitor of the memory cell. When data stored in one of the memory cells is read onto one of the bit lines, a potential difference is generated between the bit line of the respective memory cell and the bit line of another memory cell, which form a bit line pair. A bit line sense amplifier connected to the data line pair senses and amplifies the potential difference and transfers the data from the selected memory cells to a data line pair.

The storage capacitor includes a capacitor node formed by filling a deep trench with a conductor and a buried plate defined in the substrate about the deep trench. The buried plate is electrically isolated from the capacitor node by a thin node dielectric formed on the trench sidewalls. An isolation collar is required to isolate the storage capacitor electrically from the access transistor. Specifically, the isolation collar suppresses leakage and loss of charge stored by the storage capacitor arising from a vertical parasitic transistor induced in the semiconductor body in which the deep trench storage capacitor is formed. Specifically, the parasitic transistor is established between the source/drain region of the access transistor coupled with the capacitor node and the buried capacitor plate, which respectively operate as a source and drain of the parasitic transistor. The capacitor node operates as a gate of the parasitic transistor.

Traditionally, the isolation collar has consisted of an insulating material, such as oxide, formed on the trench sidewalls. However, these conventional isolation collars undesirably narrow the trench opening by projecting into the trench and, thus, increase the series resistance of the storage capacitor. Increasing the series resistance with the storage capacitor impedes charge transfer and retards read and write operations. Although the storage capacitor and access transistor may be scaled to smaller dimensions, the isolation collar is non-scalable because a minimum thickness of insulating material is required to suppress leakage of stored charge. Consequently, shrinking the trench dimensions to reduce the feature size of the storage capacitor and, optionally, the access transistor causes the trench resistance to rise to potentially unacceptable levels. Moreover, as the trench dimensions shrink, the trench becomes increasingly difficult to fill with a conductor to form the capacitor node. Specifically, the dimensions of the isolation collar must remain constant as the trench dimensions shrink. Hence, the trench constriction presented by the projecting isolation collar becomes more pronounced and significant with shrinking trench dimensions. The occluded trench may precipitate a yield loss for the process of forming the storage capacitors, which may be expected to increase with decreasing trench dimensions.

One conventional approach for solving this dilemma is to form a partially buried isolation collar outside of the deep trench by a local oxidation of silicon (LOCOS) process. However, the LOCOS process oxidizes the trench sidewalls to form the isolation collar. The LOCOS isolation collar comprises a first portion that is buried in the trench sidewall, and a second portion that protrudes into the trench. The second portion of the LOCOS collar, which protrudes into the trench, may be greater than half of the total thickness of the LOCOS isolation collar. As such, the LOCOS collar also hinders scalability of the DRAM storage trench dimensions. Because the trench sidewalls comprise various crystallographic orientations and oxidation rate exhibits a crystallographic orientation dependence, the oxide collar is not uniform around its perimeter. The LOCOS process is also complex and expensive because the deep trench must be filled with sacrificial polysilicon that is recessed multiple times and multiple dielectric layers must be deposited on the trench sidewalls as the sacrificial polysilicon is recessed. Moreover, the sacrificial polysilicon is removed from the deep trench after forming the partially buried isolation collar which, among other deleterious effects, generates defects and damages alignment marks.

What is needed, therefore, is a method for forming a buried isolation collar for a memory cell having a deep trench storage capacitor that overcomes the disadvantages of conventional methods of manufacturing such semiconductor structures.

SUMMARY OF THE INVENTION

The present invention is generally directed to methods for forming a buried isolation collar for a trench from a porous region of a substrate. In one embodiment of the invention, a method for forming a semiconductor structure comprises forming a trench having sidewalls that extend from a surface of a substrate to a bottom wall beneath the surface and forming a porous region in the substrate about the sidewalls of the trench and at a depth between the surface of the substrate and the bottom wall of the trench. The porous region is converted to an insulator to define a buried isolation collar about the trench.

In accordance with another embodiment of the present invention, the method forms a memory cell with a buried isolation collar. The method comprises forming a trench in a substrate, forming a storage capacitor having a first capacitor plate in the trench and a second capacitor plate defined in the substrate adjacent to the trench, and forming a transistor having a first source/drain region coupled electrically with the first capacitor plate and a second source/drain region. The method further comprises forming a porous region in the substrate about the trench and at a depth between the second source/drain region and the second capacitor plate. The porous region is converted to an insulator to define a buried isolation collar electrically isolating the first source/drain region from the second capacitor plate.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

FIGS. 1-7 are diagrammatic cross-sectional views of a portion of a substrate at various fabrication stages of a processing method in accordance with an embodiment of the present invention.

FIGS. 8-13 are diagrammatic cross-sectional views of a portion of a substrate at various fabrication stages of a processing method in accordance with an embodiment of the present invention.

FIGS. 21-29 are diagrammatic cross-sectional views of a portion of a substrate at various fabrication stages of a processing method in accordance with an embodiment of the present invention.

DETAILED DESCRIPTION

Figure 7A:
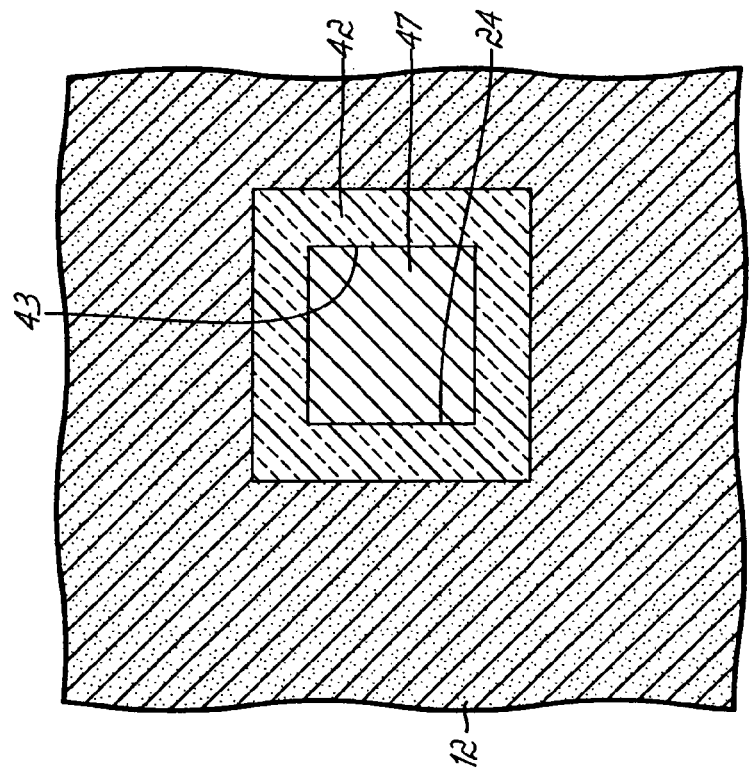
FIG. 7A is a diagrammatic cross-sectional view taken generally along line 7-7 in FIG. 7.

The present invention provides methods of forming a buried isolation collar for a deep trench storage capacitor in a DRAM memory cell. The buried isolation collar may be formed by creating a porous region, preferably a buried porous silicon region, adjacent to the deep trench sidewalls and then converting the porous region into an insulator. Structurally, the buried isolation collar may comprise nano-scale voids that enhance its isolation properties. Advantageously, the sidewalls of the buried isolation collar are coextensive with the trench sidewalls and, therefore, do not occlude the trench.

For purposes of illustration, the present invention is described in the context of a trench capacitor memory cell for use in a DRAM device. However, the present invention may be advantageous for use in trench capacitor memory cells in general. Such memory cells may be employed in other types of integrated circuits such as, for example, random access memories (RAMs), static RAMs (SRAMs), and read only memories (ROMs).

For purposes of description, the invention is described in the context of forming a single memory cell with the understanding that multiple replicas of the memory cell are formed across the substrate in order to define the DRAM device and that each of the memory cells includes a storage capacitor and buried isolation collar in accordance with the invention. The present invention will now be described in greater detail by referring to the drawings that accompany the present application.

With reference to FIG. 1, a storage capacitor 10 is formed by standard fabrication stages as one of a plurality of substantially identical storage capacitors distributed across a substrate 12, often with a matrix arrangement. The substrate 12 may be any suitable bulk substrate that a person having ordinary skill in the art would recognize as suitable for forming a DRAM device. Advantageously, substrate 12 may be any type of conventional monocrystalline semiconductor substrate, such as the illustrated bulk silicon substrate, or, for example, the active monocrystalline semiconductor layer of a semiconductor-on-insulator (SOI) substrate. Alternatively, the substrate 12 may be composed of other semiconductor materials, such as silicon-germanium.

A thin first pad layer 14 covers a top surface 15 of the substrate 12. A comparatively thick second pad layer 16 covers the pad layer 14 to define a layer stack. Pad layer 14 may be constituted by a dielectric, such as oxide ($SiO_2$) formed by a conventional thermal oxidation or chemical vapor deposition (CVD) process. Pad layer 16, which operates as a hard mask, may be composed of a dielectric. Specifically, the dielectric of pad layer 16 may be silicon nitride ($Si_3N_4$) formed by a conventional deposition process, such as a thermal CVD process or a plasma-enhanced chemical vapor deposition (PECVD) process. The material forming pad layer 16 must also etch selectively to the material constituting the substrate 12 and the constituent material of pad layer 14. Optionally, an additional pad layer (not shown) may be formed over pad layer 16. The additional pad layer may typically consist of a CVD oxide, and provides additional erosion resistance during the etching of the deep storage trench 18 into the semiconductor substrate 12.

A plurality of deep trenches, of which trench 18 is representative, is formed by a conventional lithography and etching process at locations dispersed across the surface of substrate 12. An opening 19 in the pad layers 14, 16, which collectively define a hardmask, is registered vertically with the trench 18. The conventional lithography and etching process patterns the substrate 12 by removing unprotected portions of the constituent semiconductor material of substrate 12 visible through opening 19 to define the trench 18. The lithography process applies a resist (not shown) on pad layer 16, exposes the resist to a pattern of radiation, and develops the transferred pattern in the exposed resist. The pattern is transferred to the pad layers 14, 16 using the patterned resist as an etch mask for an anisotropic dry etching process, such as a reactive-ion etching (RIE) process or a plasma etching process. Another anisotropic etch process relies on the patterned pad layers 14, 16 as a hardmask for patterning the substrate 12 by removing the constituent material of the substrate 12 across the area exposed through the opening 19 to form trench 18. The total depth of the trench 18 is determined by the desired capacitor specifications, but has sufficient depth to insure adequate capacitance for the storage capacitor 10.

Sidewalls 24, which encircle the trench 18 to define a peripheral boundary, extend in a direction substantially perpendicular or vertical to the top surface 15 of the substrate 12. A bottom wall or base 26 of trench 18 connects the sidewalls 24 and defines a bottom boundary of the trench 18 to create a substantially rectangular, cup-shaped cavity with interior walls defined by sidewalls 24 and base 26. The pad layer 16 has sidewalls 30 registered or aligned vertically with the sidewalls 24 of trench 18.

A buried capacitor plate 22 is present in the material of the semiconductor substrate 12 about the trench 18. Specifically, the buried capacitor plate 22 borders a lower portion of the sidewalls 24 and base 26 of the trench 18. The buried capacitor plate 22 may be heavily doped with, for example, an n-type dopant. Buried plate doping may be formed by a conventional process such as a high temperature dopant drive in process that out-diffluses a dopant, such as the n-type dopant arsenic, from a masked layer of doped silicate glass formed in trench 18 on a lower portion of sidewalls 24 and base 26. After the dopant has penetrated a suitable distance into the constituent material of substrate 12 to form the buried capacitor plate 22, the glass layer and the mask layer are removed in a subsequent etching process (e.g., a wet etch). Other methods of introducing a dopant into a portion of sidewalls 24 and base 26 to form buried capacitor plate 22 include gas phase doping, plasma doping, plasma immersion ion implantation, or any combination of these processes that are well known to a person having ordinary skill in the art.

A thin node dielectric 28 is formed that lines the sidewalls 24 and base 26 of trench 18. The node dielectric 28 may be any suitable dielectric material, including but not limited to silicon oxide, silicon nitride, silicon oxynitride, aluminum oxide, combinations of these dielectric materials, or another high-k material.

A capacitor node or plate 20 of storage capacitor 10, which is constituted by a conductor such as doped polycrystalline silicon (i.e., polysilicon), fills the trench 18. The capacitor plate 20 may be constituted by, for example, a heavily n-type doped polysilicon deposited by a CVD process. For example, trench 18 may be filled with heavily n-type doped polysilicon, which is planarized with a conventional chemical mechanical planarization (CMP) process that stops on the pad layer 16 and recessed vertically below the exposed surface of the pad layer 16 to a depth substantially level with the top surface 15 of the substrate 12. The node dielectric 28 separates and electrically isolates the buried capacitor plate 22 from capacitor plate 20.

With reference to FIG. 2 in which like reference numerals refer to like features in FIG. 1 and at a subsequent fabrication stage, the sidewalls 30 of pad layer 16 are receded laterally relative to the sidewalls 24 of trench 18 by a controlled pull-back process that widens the patterned opening used to form trench 18. If pad layer 16 comprises nitride, then a suitable process for receding sidewalls 30 is an isotropic nitride wet etch consisting of a solution of aqueous hydrofluoric acid (HF) and glycol. After the sidewalls 30 are receded laterally relative to the sidewalls 24, a portion 32 of the top surface 15 of the substrate 12, which is covered by a portion of the pad layer 14, is exposed and no longer masked by pad layer 16. The unmasked, exposed portion 32 extends laterally between the sidewalls 24 of the trench 18 and the receded sidewalls 30 of the pad layer 16. After the sidewalls 30 are receded, pad layer 14 covers the underlying substrate 12 and the opening 19 is widened.

Energetic ions, as indicated diagrammatically by singled-headed arrows 34, are directed by an ion implantation process into the substrate 12 to introduce a concentration profile of a dopant. Specifically, a beam of energetic ions 34 is generated from a source gas and directed to impinge an upper surface 36 of the capacitor plate 20 and the exposed portion 32 of the top surface 15 of the substrate 12 at near-normal incidence through a window surrounded by the receded sidewalls 30 of the patterned pad layer 16. Preferably, the ions 34 are implanted with the substrate 12 held at room or ambient temperature, although the present invention is not so limited. The ions 34 may originate from a source of a p-type dopant in silicon selected from gallium (Ga), aluminum (Al), boron (B), indium (In), or a combination of these dopants, and may be introduced at an atomic concentration in substrate 12 ranging from about $5\times10^{17}$ cm$^{-3}$ to about $1\times10^{21}$ cm$^{-3}$. Alternatively, the ions 34 introduce an n-type dopant selected from phosphorus (P), arsenic (As), antimony (Sb), or a combination of these dopants into the substrate 12.

As the ions 34 penetrate the substrate 12 and capacitor plate 20, the ions 34 lose energy via interactions with atoms and electrons in the constituent materials of substrate 12 and capacitor plate 20, respectively. The ions 34 eventually stop to produce an annular doped region 38 in the substrate 12 characterized by a concentration profile distributed in depth about a projected range. The stopped ions 34 also define a doped region 39 in the capacitor plate 20. The implantation energy of the ions 34 is selected such that the doped region 38 at least partially lies within the vertical extent of the buried capacitor plate 22 and, generally, is located between the top edge of the buried capacitor plate 22 and the top surface 15 of the substrate 12. The lateral edges of the annular doped region 38 are registered vertically substantially with the vertical edges of the receded sidewalls 30 of patterned pad layer 16 because of the self-alignment of the ion implantation process.

With reference to FIG. 3 in which like reference numerals refer to like features in FIG. 2 and at a subsequent fabrication stage, the capacitor plate 20 (FIG. 2) in trench 18 is recessed to, or slightly above, the depth of bottom of the doped region 38 by an anisotropic dry etching process, such as an RIE or plasma process, that removes the constituent conductor of the capacitor plate 20 selective to the material constituting the pad layer 14. The remaining portion of the capacitor plate 20 constitutes a plug 41 consisting of residual conductor from the recessed capacitor plate 20. The removed portion of the capacitor plate 20 is replaced in a subsequent fabrication stage.

When the capacitor plate 20 is partially removed, a portion of the node dielectric 28 on sidewalls 24 of trench 18 is exposed vertically above the doped region 38. The exposed portion of node dielectric 28 is stripped from the sidewalls 24 by an isotropic etching process, such as a wet etching process, that removes the constituent material of the node dielectric 28 selective to the materials constituting the plug 41 and the substrate 12. The doped region 39 within the capacitor plate 20 is removed when the capacitor plate 20 is recessed. Doped region 38, which remains resident in the substrate 12, intersects the sidewalls 24 of trench 18.

With reference to FIG. 4 in which like reference numerals refer to like features in FIG. 3 and at a subsequent fabrication stage, the doped region 38 (FIG. 3) is transformed or converted into a porous region 40 containing porous semiconductor material, which may be advantageously composed of porous silicon. The conversion is accomplished by an anodization process in an aqueous electrolyte or anodization solution that typically contains hydrofluoric acid (HF), such as a mixture of HF and a monohydric alcohol such as methanol, ethanol, or n- or iso-propanol. The monohydric alcohol is added to the solution to improve the wettability of the hydrofluoric acid. The substrate 12 is contacted with a positively-biased electrode and immersed along with a separate negatively-biased electrode into a bath of the anodization solution held at or above room temperature. The solution, which flows into the trench 18, wets the sidewalls 24 of trench 18 above the remnant plug 41 of capacitor plate 20 and the portion of the sidewalls 24 intersected by the doped region 38. An electrical current is flowed through the electrodes for an anodization time sufficient to convert the heavily doped silicon in doped region 38 into porous region 40. During anodization, a light source may be optionally used to illuminate the substrate 12. Following the anodization process, the substrate 12 is typically rinsed with deionized water and dried.

The anodization process creates pores throughout the doped region 38 (FIG. 3). The resulting porosity is proportional to material properties like the p-type dopant concentration, and to other non-material properties such as the anodization current and voltage, the acid concentration in the anodization solution, illumination, and the temperature of the anodization solution. For example, the anodization process converting the doped region 38 to porous region 40 may be carried out in an aqueous 1:1 HF (49%) and ethanol solution at a current density ranging from about 1 mA/cm$^2$ to about 40 mA/cm$^2$ in the dark and at room temperature with a process time ranging from several minutes to one hour.

With reference to FIG. 5 in which like reference numerals refer to like features in FIG. 4 and at a subsequent fabrication stage, the porous material in porous region 40 (FIG. 4) is converted to a constituent insulator of a buried isolation collar 42. Advantageously, porous silicon in the porous region 40 is converted to oxide (e.g., silicon dioxide) by a thermal oxidation process performed in a dry or wet oxidizing ambient atmosphere and at a temperature ranging from about 750° C. to about 1100° C.

The constituent material of buried isolation collar 42 may include voids that may contain a vacuum or be filled with air or other gas. These voids enhance the electrical isolation properties of the oxide by creating a lower effective dielectric constant than bulk oxide. The lowest possible, or ideal, dielectric constant is 1.0, which is the dielectric constant of a vacuum. Air, which is almost equivalent to vacuum, has a dielectric constant of 1.001. In contrast, bulk silicon dioxide has a dielectric constant of about 4.2. Although not wishing to be limited by theory, silicon dioxide with evacuated or gas-filled voids is expected to have a dielectric constant less than about 4.2.

The thermal oxidation process also forms a thin layer 44 of oxide on the exposed portion of sidewalls 24. However, because oxygen-containing species diffuse rapidly through the porous material constituting porous region 40 and the porous region 40 has a high surface area that results in a high oxidation rate in comparison to bulk material, the oxidation time required to fully convert the porous region 40 to insulating material is short so that oxide layer 44 is comparatively thin.

The buried isolation collar 42 is ring shaped and encircles the trench 18. The buried isolation collar 42 includes sidewalls 43 that border the trench 18. The sidewalls 43 of the buried isolation collar 42 and the sidewalls 24 of the trench 18 are substantially coplanar so that the buried isolation collar 42 does not project beyond sidewalls 24 and protrude into the trench 18. As a result, the buried isolation collar 42 does not occlude or obstruct the trench 18.

The substrate 12 may be processed to reduce the residual dopant concentration in the constituent insulator material of buried isolation collar 42. Optionally, the residual dopant may be allowed to remain, since it raises the threshold voltage of the parasitic vertical transistor and may improve isolation. One process suitable for reducing the dopant concentration in buried isolation collar 42 is an anneal or thermal treatment in a reducing atmosphere, such as H$_2$ or NH$_3$, at a temperature between 850° C. and 1100° C., and for a time ranging from about 10 seconds to about 30 minutes.

With reference to FIG. 6 in which like reference numerals refer to like features in FIG. 5 and at a subsequent fabrication stage, the thin layer 44 (FIG. 5) is removed from the sidewalls 24 of trench 18. The region of trench 18 above the remnant plug 41 of capacitor plate 20 is filled with a plug 47 of a conductor, such as heavily n-type doped polysilicon, that is recessed to a depth above the top surface of the buried isolation collar 42. Plug 47 replaces the conductor portion removed in a prior fabrication stage from capacitor plate 20. Plug 41 and plug 47 collectively reconstitute the capacitor plate 20 of storage capacitor 10. The node dielectric 28 is present between the capacitor plates 20, 22 for portions of sidewalls 24 vertically below the buried isolation collar 42.

Figure 7:
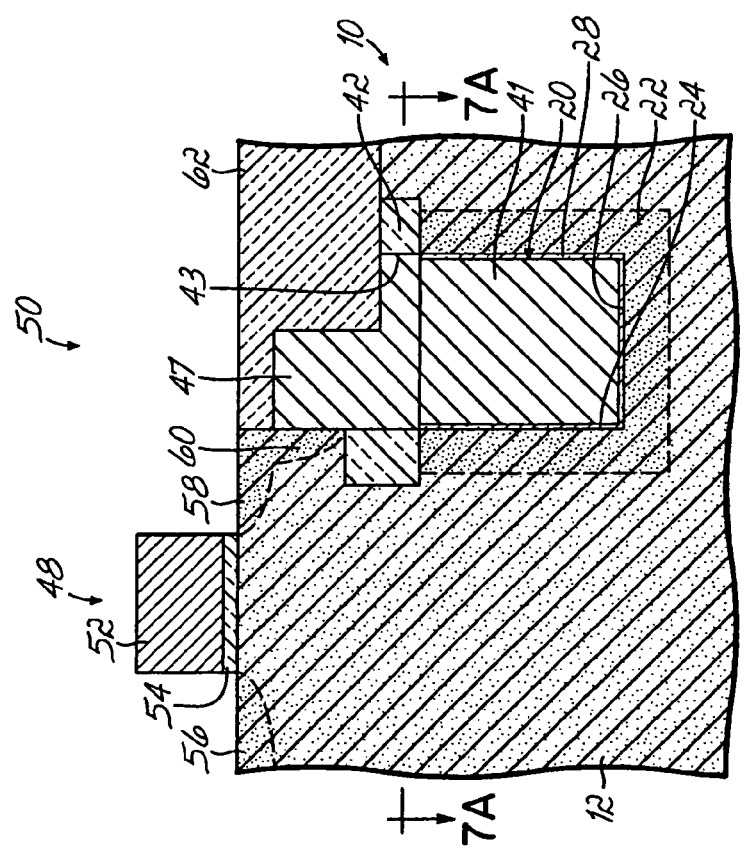

With reference to FIGS. 7 and 7A in which like reference numerals refer to like features in FIG. 6 and at a subsequent fabrication stage, standard processes are then performed to complete the formation of a memory cell 50. To that end, a transistor 48 is fabricated that is electrically coupled with the storage capacitor 10 for allowing the transfer of data charges to and from the storage capacitor 10 during reading and writing operations of the DRAM device. Buried isolation collar 42, as well as the implanted region 38 and porous region 40 antecedent to buried isolation collar 42, extends in the substrate 12 about the sidewalls 24 of the trench 18 and at a depth between the surface 15 of the substrate 12 and the base 26 of the trench 18, as is best shown in FIG. 7A.

Transistor 48 may have any suitable construction as recognized by a person having ordinary skill in the art. For example, transistor 48 may be a planar metal oxide semiconductor field-effect transistor (MOSFET) formed on the surface of the substrate 12 and having a gate electrode 52 isolated from the substrate 12 by a gate dielectric 54, and source/drain regions 56, 58 flanking the gate electrode 52. A conductive strap connection 60, which forms part of the source-drain region 58, electrically couples the capacitor plate 20 with source/drain region 58. The other source/drain region 56 is coupled to a bitline (not shown) of the DRAM device and the gate electrode 52 is coupled to a wordline (not shown). Applying an appropriate voltage to the gate electrode 52 switches the transistor 48 on, enabling current to flow through a channel defined in the material of the substrate 12 between the source/drain region 58 to form an electrical connection between the storage capacitor 10 and bitline. Switching off the transistor 48 breaks this connection by preventing current flowing through the channel between the source/drain regions 56, 58. Alternatively, transistor 48 may be a vertical transistor formed in trench 18 above the buried isolation collar 42 or a fin-type field effect transistor (FinFET), each of which has similar constituent components to the illustrated MOSFET.

Numerous other memory cells (not shown), each substantially identical to memory cell 50 are fabricated simultaneously with memory cell 50 and are distributed across substrate 12. Memory cell 50 is isolated from other adjacent memory cells (not shown) by device isolation regions, of which one device isolation region 62 is shown in FIG. 7. These device isolation regions 62 may be formed by, for example, a shallow trench isolation (STI) technique that includes a conventional lithography and dry etching process to create trenches followed by filling the trenches with a dielectric material, such as a dense oxide anisotropically deposited by a high density plasma chemical vapor deposition (HDP-CVD) process, and then planarization with a CMP process. The device isolation regions 62 partition the semiconductor material of the substrate 12 into isolated active area regions or islands and assist in preventing carrier migration between adjacent memory cells 50. Each device isolation region 62, which partially overlies the trench 18, extends to a depth in substrate 12 that intersects the buried isolation collar 42 and that is below the conductive strap connection 60.

In an alternative embodiment of the present invention, the buried isolation collar 42 may be formed before the capacitor plate 20 is fabricated. Accordingly, a portion of the conductor constituting the capacitor plate 20 does not have to be removed from the trench 18 during the process stages forming the buried isolation collar 42.

With reference to FIGS. 8 and 9 in which like reference numerals refer to like features in FIG. 1 and in accordance with the alternative embodiment, the trench 18 and buried capacitor plate 22 are formed. The sidewalls 30 of pad layer 16, which are initially aligned or registered with the sidewalls 24 of trench 18, are receded laterally by a controlled pullback process, as described above with regard to FIG. 2, to widen opening 19. Using the pad layer 16 as an implantation mask, the doped region 38 is formed by implanting ions 34 into the substrate 12, as described above with regard to FIG. 3. An extraneous doped region 66 is formed in the substrate 12 at a depth below the base 26 of the trench 18.

A thin protective screen layer 64 is provided on sidewalls 24 and base 26 of trench 18 before ion implantation to protect the exposed silicon bordering the sidewalls 24 and base 26 of trench 18 from damage during ion implantation. The screen layer 64 may consist of, for example, oxide formed by thermal oxidation of the constituent material of the substrate 12 bordering the sidewalls 24 and base 26 of trench 18 in a dry or wet oxidizing ambient atmosphere and at a temperature ranging from about 750° C. to about 1100° C.

With reference to FIG. 10 in which like reference numerals refer to like features in FIG. 9 and at a subsequent fabrication stage, the doped region 38 (FIG. 9) is transformed or converted into a porous region, not shown but identical to porous region 40 (FIG. 4), as described above with regard to FIG. 4. The porous material in the porous region 40 is converted to the constituent insulator of the buried isolation collar 42, as described above with regard to FIG. 5. An optional thermal treatment may be performed in a reducing atmosphere for purposes of reducing the dopant concentration in the buried isolation collar 42, as also described above with regard to FIG. 5.

The buried isolation collar 42 is ring shaped and extends about or encircles the trench 18. The buried isolation collar 42 includes sidewalls 43 that border the trench 18. The sidewalls 43 of the buried isolation collar 42 and the sidewalls 24 of the trench 18 are substantially coplanar or flush so that the buried isolation collar 42 does not project or protrude into the trench 18.

Figure 11:
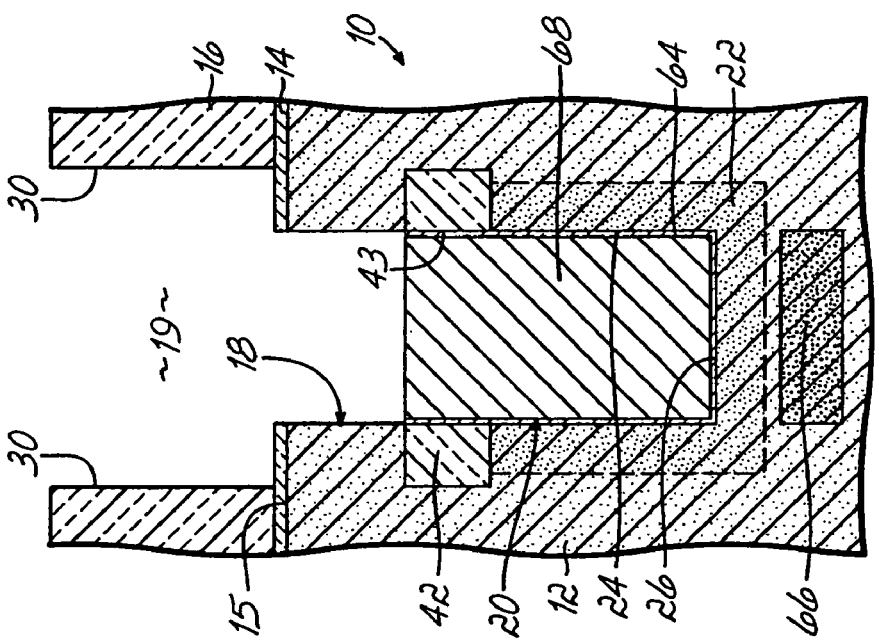

With reference to FIG. 11 in which like reference numerals refer to like features in FIG. 10 and at a subsequent fabrication stage, the screen layer 64 is removed, as well as any additional material (e.g., oxide) added to the screen layer 64 when the buried isolation collar 42 is formed. The node dielectric 28 is formed on the sidewalls 24 of trench 18, as described above with regard to FIG. 1. A plug 68 is formed by filling trench 18 with a conductor (e.g., doped polysilicon) and planarizing to remove excess conductor from the pad layer 16. The material of the plug 68 is recessed vertically to approximately the same vertical level or depth in the trench 18 as the top surface of the buried isolation collar 42. When the plug 68 is recessed, a portion of the node dielectric 28 is exposed in the upper portion of trench 18. This exposed portion of the node dielectric 28 is then removed to reveal the sidewalls 24 of the trench 18 above the buried isolation collar 42.

Figure 12:
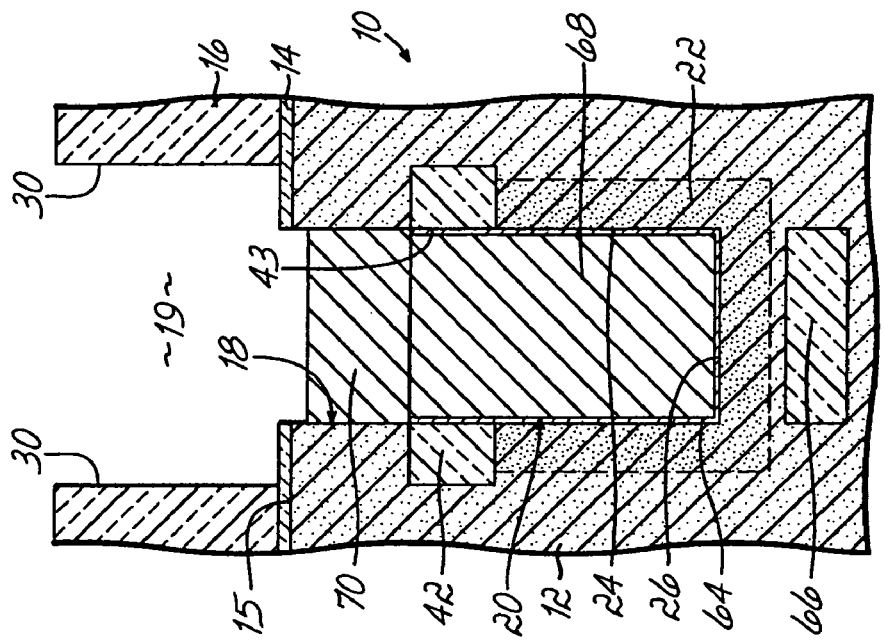

With reference to FIG. 12 in which like reference numerals refer to like features in FIG. 11 and at a subsequent fabrication stage, a plug 70 is formed in the top region of trench 18 above plug 68 by filling with a conductor, planarizing to remove excess conductor from the pad layer 16, and recessing vertically to a depth above the top surface of the buried isolation collar 42. Plugs 68, 70 collectively constitute capacitor plate 20 and, after plug 70 is formed, the components of storage capacitor 10 are present.

Figure 13:
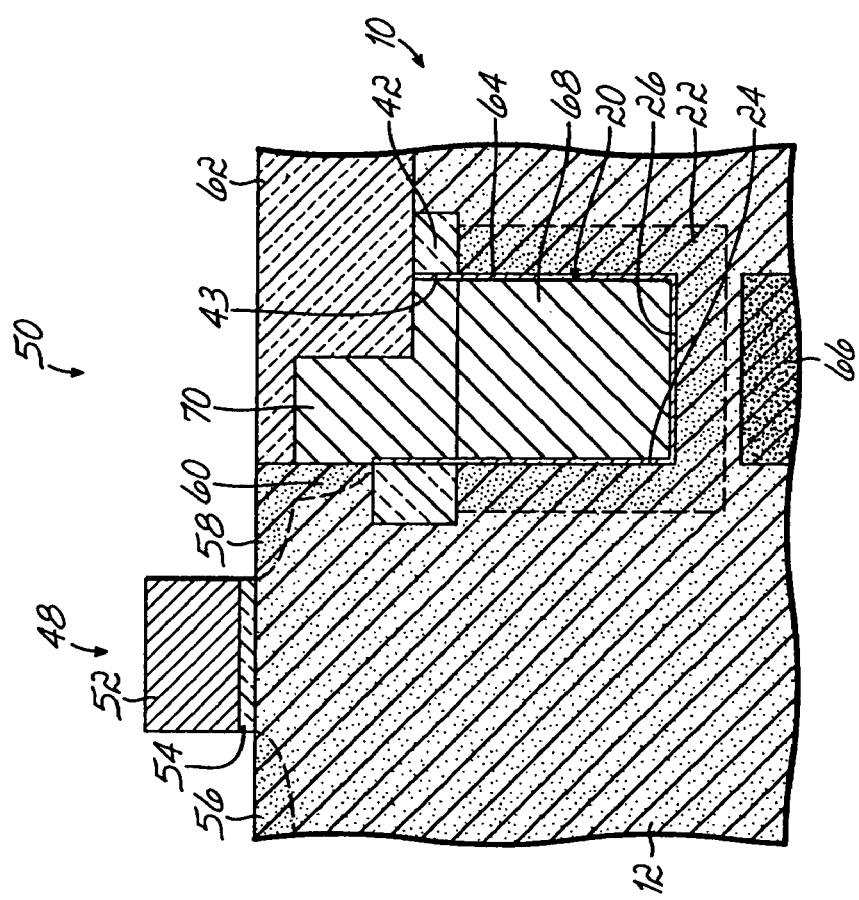

With reference to FIG. 13 in which like reference numerals refer to like features in FIG. 12 and at a subsequent fabrication stage, memory cell 50 is completed by forming transistor 48 and device isolation region 62, as described above with regard to FIG. 7.

In another alternative embodiment of the present invention, the doped region 38 is formed before the trench 18 is extended into the substrate 12. This eliminates the need for a controlled pullback process to recede the sidewalls 30 of pad layer 16 relative to the sidewalls 24 of trench 18. Additionally, the capacitor plate 20 and the buried capacitor plate 22 are formed in the trench 18 after the buried isolation collar 42 is formed. Forming the buried capacitor plate 22 after the buried isolation collar 42 is formed is advantageous because the lateral edges of the buried capacitor plate 22 and the buried isolation collar 42 may be precisely self-aligned. In particular, the presence of the buried isolation collar 42 masks the delivery of the dopant forming the buried capacitor plate 22.

Figure 14:
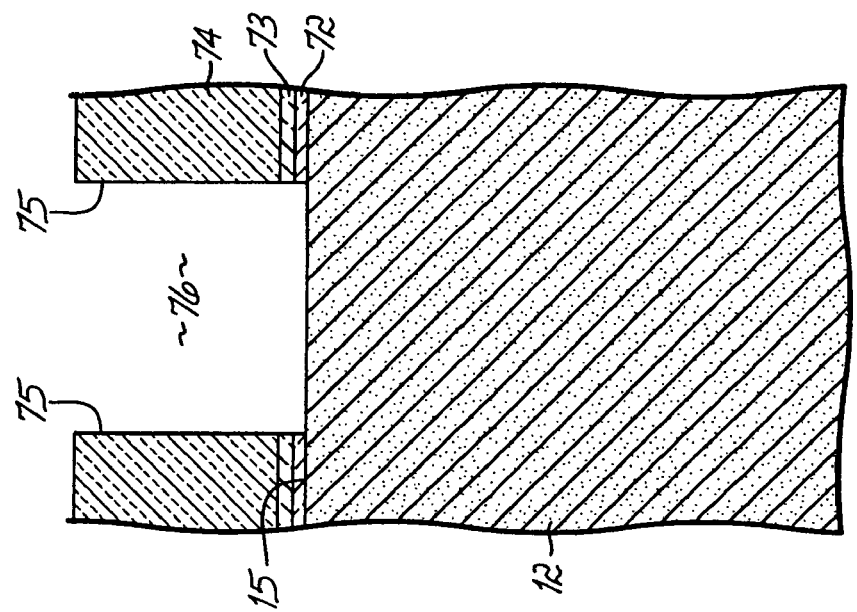
FIGS. 14-20 are diagrammatic cross-sectional views of a portion of a substrate at various fabrication stages of a processing method in accordance with an embodiment of the present invention.

With reference to FIG. 14 in which like reference numerals refer to like features in FIG. 1 and in accordance with the alternative embodiment, pad layers 72, 73, similar to, but thinner than, pad layers 14, 16 (FIG. 1), are formed on the top surface 15 of the substrate 12. A hardmask layer 74 of, for example, oxide deposited by PECVD, HDPCVD, or low pressure chemical vapor deposition (LPCVD), is formed on an exposed surface of the pad layers 72, 73. The hardmask layer 74 and pad layers 72, 73 are patterned by standard lithographic and etching processes to form windows or openings, such as an opening 76 that is visible in FIG. 14, that extend vertically to the top surface 15 of substrate 12.

Figure 15:
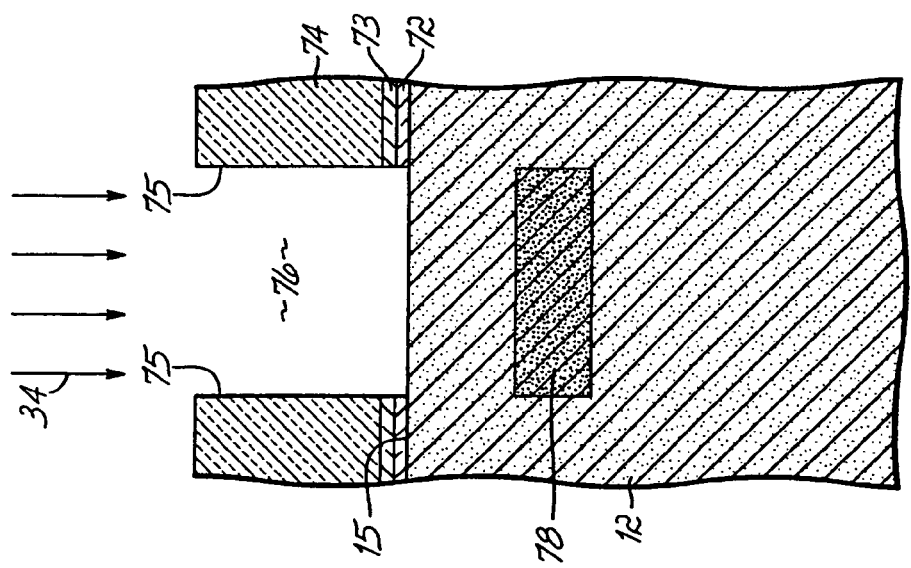

With reference to FIG. 15 in which like reference numerals refer to like features in FIG. 14 and at a subsequent fabrication stage, ions 34 are implanted into the substrate 12, as described above with regard to FIG. 3, through opening 76 to form a doped region 78 in the substrate 12. The doped region 78 is self-aligned vertically to, or registered with, the sidewalls of the hardmask layer 74 and pad layers 72, 73. Specifically, the side edges or boundaries of the doped region 78 are vertically aligned or registered with sidewalls 75 of the hardmask layer 74 that bounds opening 76. The hardmask layer 74 masks areas of the top surface 15 not visible through the windows 76 against receiving an implanted dose of the ions 34.

Figure 16:
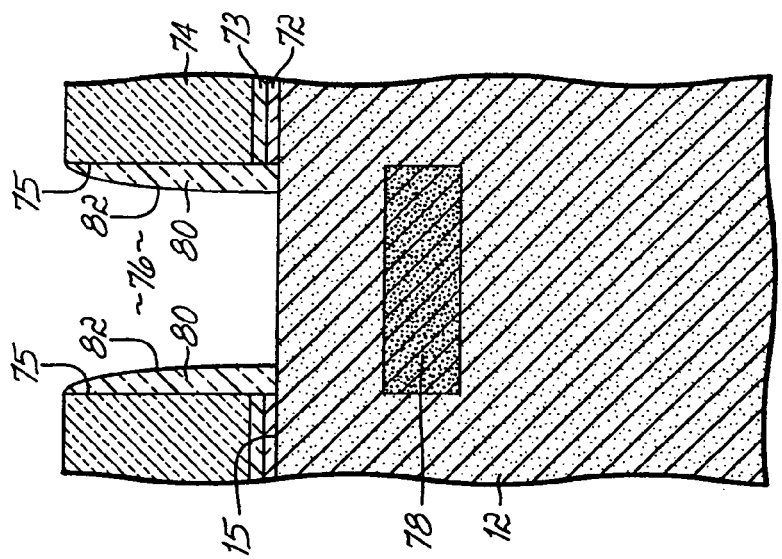

With reference to FIG. 16 in which like reference numerals refer to like features in FIG. 15 and at a subsequent fabrication stage, sidewall spacers 80 are formed adjacent to the sidewalls of the pad layers 72, 73 and the sidewalls 75 of hardmask layer 74. Spacers 80 may be formed from a conformal layer (not shown) of a dielectric material, such as 5 nm to 50 nm of nitride or oxide deposited by a thermal CVD process, that is anisotropically etched using an RIE or plasma etching process, that removes the material of the conformal layer primarily from horizontal surfaces selective to (i.e., with a significantly greater etch rate than) vertical surfaces. The sidewall spacers 80 narrow the opening 76, which reduces or narrows the area of the top surface 15 of substrate 12 exposed through the narrowed opening 76.

Figure 17:
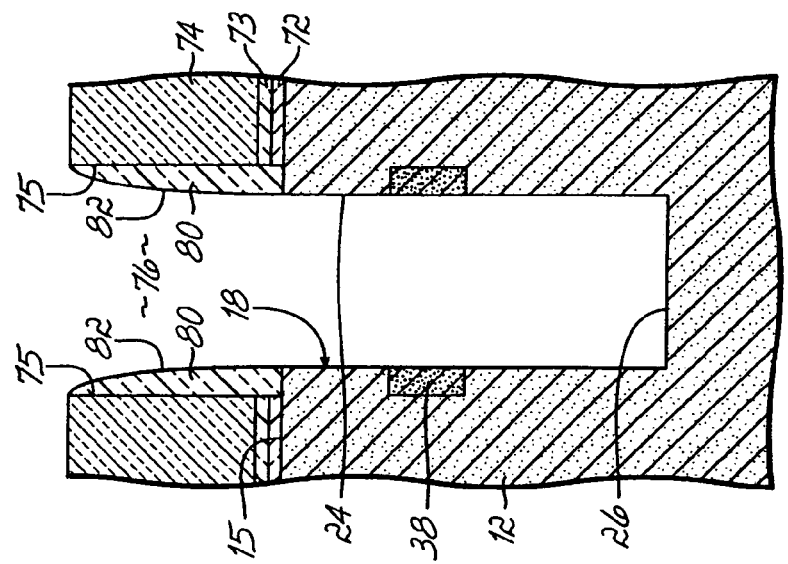

With reference to FIG. 17 in which like reference numerals refer to like features in FIG. 16 and at a subsequent fabrication stage, the trench 18 is then formed in the substrate 12, as described above with regard to FIG. 1. As the trench 18 is formed, a central portion of the doped region 78 is removed to leave the doped region 38 that rings the trench 18. A sidewall 82 of each sidewall spacer 80 masks the underlying material of substrate 12 such that the peripheral portions of the doped region 78 remains, after the trench 18 is formed by the anisotropic etching process, to constitute doped region 38. The doped region 38 is ring shaped and encircles the trench 18.

Figure 18:
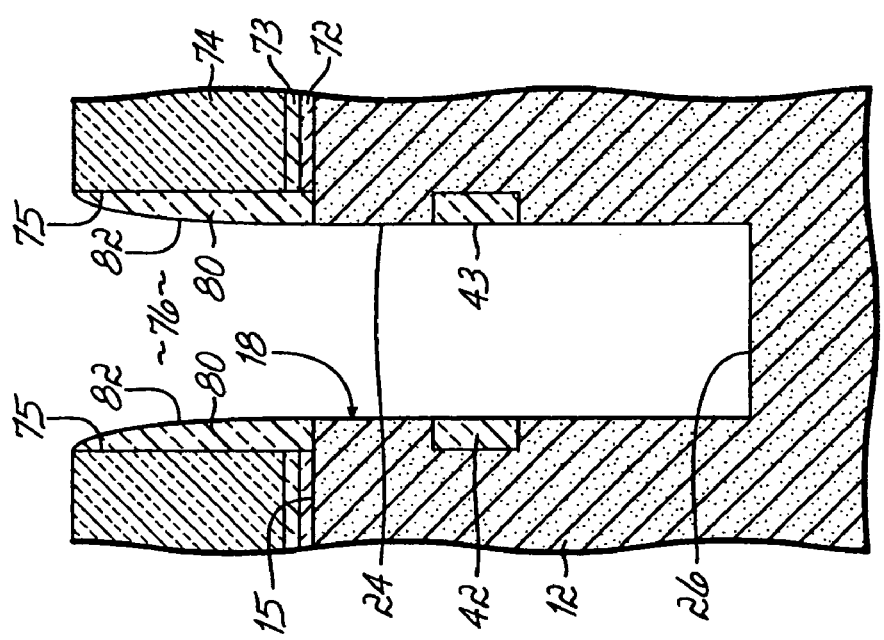

With reference to FIG. 18 in which like reference numerals refer to like features in FIG. 17 and at a subsequent fabrication stage, the doped region 38 (FIG. 17) is transformed or converted into a porous region, not shown but identical to porous region 40 (FIG. 4), as described above with regard to FIG. 4. The porous material in the porous region is converted to the constituent insulator of the buried isolation collar 42, as described above with regard to FIG. 5. An optional thermal treatment may be performed in a reducing atmosphere to reduce the dopant concentration in the buried isolation collar 42, as also described above with regard to FIG. 5. Alternatively, the doped region 38 may be converted into porous silicon before forming the trench 18 and then converted into the constituent material of buried isolation collar 42 after forming the deep trench 18. In yet another alternative embodiment, the doped region 38 may be converted into a buried insulator layer before forming the trench 18 by an internal total oxidation (ITOX) process as understood by a person having ordinary skill in art.

The buried isolation collar 42 is ring shaped and encircles the trench 18. The buried isolation collar 42 includes sidewalls 43 that border the trench 18. The sidewalls 43 of the buried isolation collar 42 and the sidewalls 24 of the trench 18 are substantially coplanar so that the buried isolation collar 42 does not project into the trench 18. As a result, the buried isolation collar 42 does not occlude or obstruct the trench 18 during subsequent processes.

Figure 19:
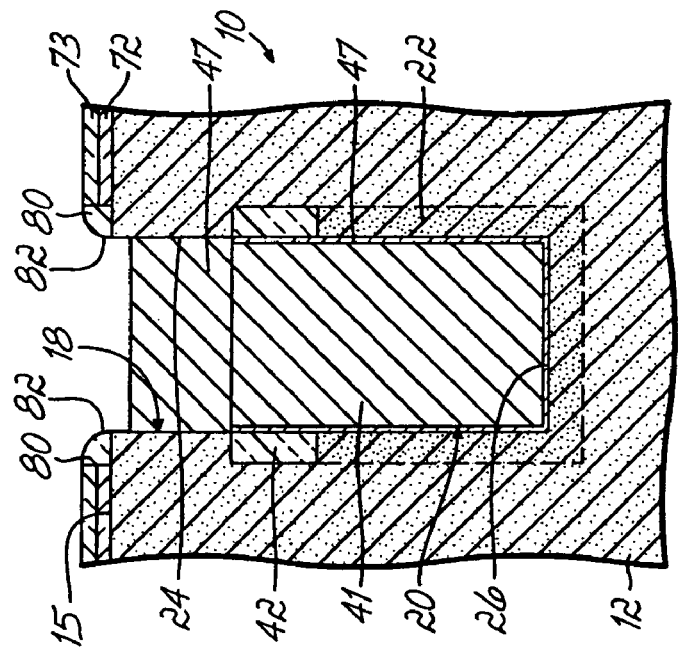

With reference to FIG. 19 in which like reference numerals refer to like features in FIG. 18 and at a subsequent fabrication stage, the storage capacitor 10 is formed in the trench 18. The capacitor plate 20, buried capacitor plate 22, and node dielectric 28 of the storage capacitor 10 are formed as described above with regard to FIG. 1. The remaining hardmask 74 is removed after forming the trench 18.

Figure 20:
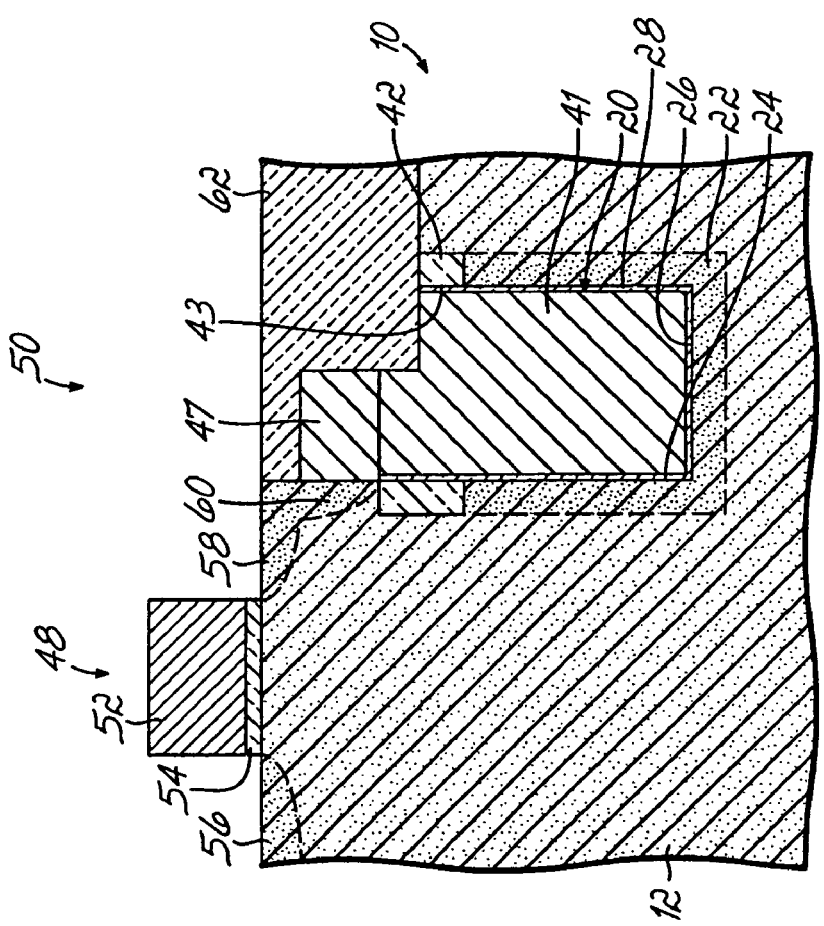

With reference to FIG. 20 in which like reference numerals refer to like features in FIG. 19 and at a subsequent fabrication stage, memory cell 50 is completed by forming transistor 48 and device isolation region 62, as described above with regard to FIG. 7.

In another alternative embodiment of the present invention, the buried isolation collar 92 (FIG. 26) may be formed by introducing the dopant with a method other than ion implantation and in a self-aligned manner.

Figure 21:
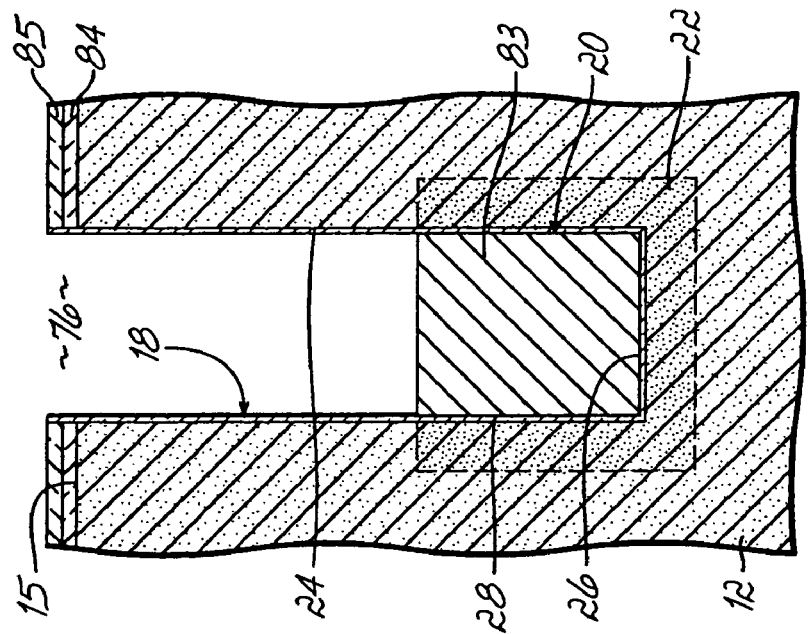

With reference to FIG. 21 in which like reference numerals refer to like features in FIG. 1 and in accordance with the alternative embodiment, pad layers 84, 85, similar to pad layers 14, 16 (FIG. 1), are formed on the top surface 15 of the substrate 12. The thickness of pad nitride layer 85 should be sufficient to avoid being completely eroded by subsequent processing steps. The buried capacitor plate 22 and the node dielectric 28 of storage capacitor 10 are formed in the trench 18, as described above with regard to FIG. 1. A plug 83 is formed in the bottom region of trench 18 by filling with a conductor and recessing to a depth similar to the top of the buried capacitor plate 22. The constituent material of the capacitor plate 20 is recessed to the top edge of the buried capacitor plate 22. Optionally, a thin conformal nitride liner may be formed by CVD on the exposed sidewalls of the trench above the recessed capacitor plate 20. The thin nitride liner preserves the integrity of the portion of the sidewall insulation between the top of the buried capacitor plate 22 and bottom of the isolation collar 92 (see FIG. 26) during subsequent removal of protective cap 86 (FIG. 26).

With reference to FIG. 22 in which like reference numerals refer to like features in FIG. 21 and at a subsequent fabrication stage, the trench 18 above the capacitor plate 20 is filled with a protective cap 86 of a dielectric material, such as oxide deposited by LPCVD, HDPCVD, PECVD, or spin-on-glass (SOG). The constituent material of the protective cap 86 is then recessed to a depth below the top surface 15 of substrate 12.

With reference to FIG. 23 in which like reference numerals refer to like features in FIG. 22 and at a subsequent fabrication stage, sidewall spacers 88 are formed adjacent to the sidewalls of the pad layers 84, 85 and a top portion of the sidewalls 24 of trench 18. Spacers 88 may be formed from a conformal layer (not shown) of a dielectric material, such as 5 nm to 50 nm of nitride deposited by a thermal CVD process, that is anisotropically etched using an RIE or plasma etching process, that removes the material of the conformal layer primarily from horizontal surfaces selective to vertical surfaces. The spacers 88 narrow the top portion of the trench 18 so that the area of the top surface exposed through the opening 76 is reduced.

With reference to FIG. 24 in which like reference numerals refer to like features in FIG. 23 and at a subsequent fabrication stage, the constituent material of the protective cap 86 is recessed to a depth below the bottom surface of the sidewall spacers 88 with an isotropic etching process, which reveals a portion 25 of the sidewalls 24 of trench 18 below the spacers 88 and above the recessed top surface of protective cap 86. The portion of the node dielectric 28 on the revealed portion 25 of sidewall 24 is removed to expose the constituent material of substrate 12 along this portion 25 of the trench sidewall 24.

With reference to FIG. 25 in which like reference numerals refer to like features in FIG. 24 and at a subsequent fabrication stage, a doped region 90, similar to doped region 38 (FIG. 4) is formed in the material of the substrate 12. The doped region 90 may be formed by, for example, gas phase doping that exposes the revealed portion 25 of the trench sidewalls 24 to the dopant. The portion of the sidewalls 24 covered by spacers 88 is protected from exposure to the dopant. Similarly, the capacitor plate 20 is protected from exposure to the dopant by protective cap 86. The dopant diffuses into the material of the substrate 12 along the revealed portion 25 of trench sidewalls 24.

With reference to FIG. 26 in which like reference numerals refer to like features in FIG. 25 and at a subsequent fabrication stage, the doped region 90 is converted into a porous region, not shown but similar to porous region 40 (FIG. 4), as described above with regard to FIG. 4. The porous material in the porous region is converted to the constituent insulator of a buried isolation collar 92, as described above with regard to the formation of isolation collar 42 in FIG. 5, which is similar to buried isolation collar 42 (FIG. 5). An optional thermal treatment may be performed in a reducing atmosphere to reduce the dopant concentration in the buried isolation collar 92, as also described above with regard to FIG. 5.

The buried isolation collar 92 is ring shaped and encircles the trench 18. The buried isolation collar 92 includes sidewalls 93 that border the trench 18. The sidewalls 93 of the buried isolation collar 92 and the sidewalls 24 of the trench 18 are substantially coplanar so that the buried isolation collar 92 does not project into the trench 18. As a result, the buried isolation collar 92 does not occlude or obstruct the trench 18 during subsequent fabrication stages.

With reference to FIG. 27 in which like reference numerals refer to like features in FIG. 26 and at a subsequent fabrication stage, the protective cap 86 and the spacer 88 are removed so that the top portion of the trench 18 is unoccluded and the top surface of the capacitor plate 20 is exposed. Specifically, the spacer 88 is removed by an etching process that removes the constituent material (e.g., nitride) of the spacer 88 selective to the constituent material (e.g., oxide) of the protective cap 86. More specifically, nitride constituting spacer 88 may be removed selective to oxide constituting protective cap 86 by hot phosphoric acid. The protective cap 86 is then removed by a process that removes the constituent material of cap 86 selective to the material constituting the node dielectric 28. Although a portion of nitride pad layer 85 is eroded during the removal of nitride spacers 88, a sufficient thickness remains to protect underlying oxide pad layer 84 during removal of protective oxide cap 86. For example, if the node dielectric 28 is composed of nitride, a buffered hydrofluoric (BHF) may be used to remove oxide constituting protective cap 86.

Figure 28:
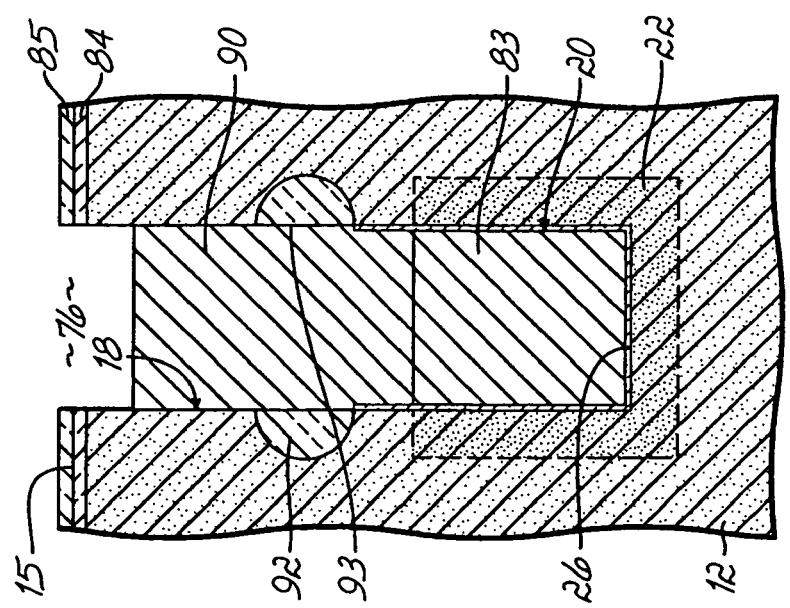

With reference to FIG. 28 in which like reference numerals refer to like features in FIG. 27 and at a subsequent fabrication stage, a plug 90 is formed in the region of trench 18 above plug 83 by filling with a conductor and recessing to a depth above the top surface of the buried isolation collar 42. Plugs 83, 90 collectively constitute the capacitor plate 20 that completes the formation of the storage capacitor 10.

Figure 29:
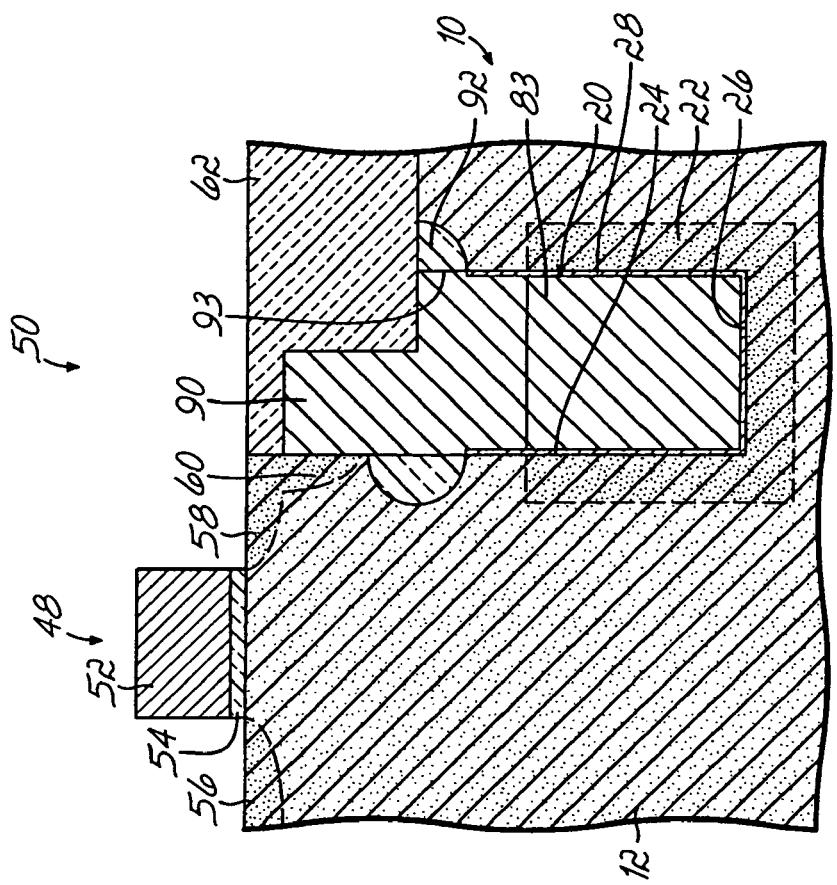

With reference to FIG. 29 in which like reference numerals refer to like features in FIG. 28 and at a subsequent fabrication stage, memory cell 50 is completed by forming transistor 48 and device isolation region 62, as described above with regard to FIG. 7.

References herein to terms such as "vertical", "horizontal", etc. are made by way 5 of example, and not by way of limitation, to establish a frame of reference. The term "horizontal" as used herein is defined as a plane parallel to the conventional plane or surface of substrate 12, regardless of the actual spatial orientation of semiconductor substrate 12. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method for forming a semiconductor structure, comprising:
    patterning a hardmask to define an opening;
    etching an area on a surface of a substrate exposed through the opening in the patterned hardmask to form a trench having sidewalls that extend from the surface to a bottom wall beneath the surface;
    widening the opening after the trench is formed such that the widened opening in the patterned hardmask is wider than the trench;
    implanting dopant ions through the widened opening to define a doped region in the substrate that extends about the sidewalls of the trench and is registered between the widened opening and the sidewalls of the trench;
    forming a porous region in the substrate about the sidewalls of the trench and at a depth between the surface of the substrate and the bottom wall of the trench; and
    converting the porous region to an insulator to define a buried isolation collar about the trench.

2. The method of claim 1 wherein the porous region includes porous silicon, and further comprising:
    oxidizing the porous silicon to form an oxide that defines the buried isolation collar.

3. The method of claim 1 further comprising:
    at least partially filling the trench with a conductor before the dopant ions are implanted.

4. The method of claim 1 wherein forming the porous region in the substrate further comprises:
    transforming the doped region into the porous region.

5. A method for forming a semiconductor structure, comprising:
    patterning a hardmask to define an opening;
    implanting dopant ions through the opening to define a doped region in a substrate;
    narrowing the opening in the patterned hardmask;
    etching a surface of the substrate exposed through the narrowed opening in the patterned hardmask to a depth greater than a projected range of the ions to form a trench having sidewalls that extend from the surface to a bottom wall beneath the surface and to define a doped region extending about the sidewalls of the trench that is registered between the opening and the sidewalls of the trench;
    forming a porous region in the substrate about the sidewalls of the trench and at a depth between the surface of the substrate and the bottom wall of the trench; and
    converting the porous region to an insulator to define a buried isolation collar about the trench.

6. The method of claim 5 wherein forming the porous region in the substrate further comprises:
    transforming the doped region into the porous region.

7. A method for forming a semiconductor structure, comprising:
    forming a trench having sidewalls that extend from a surface of a substrate to a bottom wall beneath the surface;
    filling the trench with an insulator;
    forming spacers on the sidewalls of the trench above the insulator;
    recessing the insulator to expose a portion of the sidewalls of the trench between the spacers and the insulator;
    introducing a dopant into the substrate through the exposed portion of the sidewalls to define a doped region;

forming a porous region in the substrate about the sidewalls of the trench and at a depth between the surface of the substrate and the bottom wall of the trench; and converting the porous region to an insulator to define a buried isolation collar about the trench.

8. The method of claim 7 wherein forming the porous region in the substrate further comprises:

transforming the doped region into the porous region.

9. A method for forming a memory cell, comprising:

forming a trench in a substrate;

forming a first capacitor plate of a storage capacitor in the trench;

forming a second capacitor plate buried in the substrate about the trench;

forming a transistor having a first source/drain region coupled electrically with the first capacitor plate and a second source/drain region;

forming a porous region in the substrate about sidewalls of the trench and at a depth between the second source/drain region and the second capacitor plate; and converting the porous region to an insulator to define a buried isolation collar electrically isolating the first source/drain region from the second capacitor plate.

10. The method of claim 9 wherein the porous region includes porous silicon, and further comprising:

oxidizing the porous silicon to form an oxide that defines the buried isolation collar.

11. The method of claim 9 wherein forming the trench further comprises:

patterning a hardmask to define an opening; and etching an area of the substrate exposed through the opening in the patterned hardmask to form the trench.

12. The method of claim 11 further comprising:

widening the opening in the patterned hardmask such that the widened opening in the patterned hardmask is wider than the trench; and implanting dopant ions through the widened opening to define a doped region in the substrate that extends about the sidewalls of the trench and is aligned with the widened opening.

13. The method of claim 12 wherein the first capacitor plate is formed in the trench before the dopant ions are implanted, and forming the porous region in the substrate further comprises:

recessing the first capacitor plate to a depth within the trench that exposes the doped region of the substrate along the sidewalls of the trench; and transforming the doped region into the porous region.

14. The method of claim 12 wherein the first capacitor plate is formed in the trench after the dopant ions are implanted and after the porous region is converted to the insulator, and forming the porous region in the substrate further comprises:

transforming the doped region into the porous region.

15. The method of claim 9 further comprising:

patterning a hardmask to define an opening; and ion implanting a dopant into the substrate through the opening before the trench is formed.

16. The method of claim 15 wherein forming the trench further comprises:

narrowing the opening in the patterned hardmask; and etching the surface through the narrowed opening in the patterned hardmask to a depth greater than a projected range of the ions to form the trench and to define a doped region extending about the sidewalls of the trench that is registered between the narrowed opening and the sidewalls of the trench.

17. The method of claim 16 wherein forming the porous region in the substrate further comprises:

transforming the doped region into the porous region before the second capacitor plate is formed in the trench.

18. The method of claim 16 wherein narrowing the opening further comprises:

forming sidewall spacers on sidewalls of the opening.

19. The method of claim 9 wherein forming the porous region in the substrate further comprises:

filling the trench with an insulator;

forming spacers on the sidewalls of the trench above the insulator;

recessing the insulator to expose a portion of the sidewalls of the trench between the spacers and the insulator; and introducing a dopant into the substrate through the exposed portion of the sidewalls to define a doped region.

20. The method of claim 19 wherein forming the porous region in the substrate further comprises:

transforming the doped region into the porous region.

* * * * *